(12) United States Patent  
Nagasawa (10) Patent No.: US 7,057,102 B2
(45) Date of Patent: Jun. 6, 2006

(54) SOLAR CELL MODULE AND PORTABLE ELECTRONIC APPARATUS WITH IT

(75) Inventor: Ken Nagasawa, Tokorozawa (JP)

(73) Assignee: Citizen Watch Co., Ltd., Tokyo (JP)

( * ) Notice: Subject to any disclaimer, the term of this patent is extended or adjusted under 35 U.S.C. 154(b) by 310 days.

(21) Appl. No.: 10/149,442

(22) PCT Filed: Nov. 7, 2001

(86) PCT No.: PCT/JP01/09723

§ 371 (c)(1),
(2), (4) Date: Jun. 26, 2002

(87) PCT Pub. No.: WO02/39504

PCT Pub. Date: May 16, 2002

(65) Prior Publication Data

US 2002/0189663 A1    Dec. 19, 2002

(30) Foreign Application Priority Data

Nov. 10, 2000  (JP) .............................. 2000-342992

(51) Int. Cl.
*H01L 31/042* (2006.01)
*G04C 10/00* (2006.01)

(52) U.S. Cl. .................. 136/251; 136/244; 136/256; 136/291; 368/80; 368/88; 368/205; 323/906; 257/432; 257/433; 257/434; 257/435

(58) Field of Classification Search ................ 136/251, 136/244, 256, 291; 368/80, 88, 205; 323/906; 257/432, 433, 434, 435

See application file for complete search history.

(56) References Cited

U.S. PATENT DOCUMENTS

| | | | | |
|---|---|---|---|---|
| 3,670,491 A | * | 6/1972 | Weschler | 368/204 |
| 4,737,941 A | * | 4/1988 | Kamiyama et al. | 368/77 |
| 4,755,231 A | * | 7/1988 | Kurland et al. | 136/244 |
| 5,254,179 A | * | 10/1993 | Ricaud et al. | 136/244 |
| 5,542,988 A | * | 8/1996 | Bogus | 136/244 |
| 5,919,316 A | * | 7/1999 | Bogorad et al. | 136/256 |
| 6,194,651 B1 | * | 2/2001 | Stark et al. | 136/256 |
| 6,372,977 B1 | * | 4/2002 | Miyoshi | 136/246 |
| 6,521,822 B1 | * | 2/2003 | Ito et al. | 136/244 |
| 6,713,670 B1 | * | 3/2004 | Stern et al. | 136/251 |

FOREIGN PATENT DOCUMENTS

GB        2224391 A     *    5/1990

(Continued)

OTHER PUBLICATIONS

The Random House College Dictionary, p. 1033 (1973).*

(Continued)

*Primary Examiner*—Alan Diamond
(74) *Attorney, Agent, or Firm*—Westerman, Hattori Daniels & Adrian, LLP (57) ABSTRACT

A solar battery module (5) is provided by forming a solar battery (13) on a surface on one side of an insulating substrate (12) and forming an electrode thin film (11), which is connectable to a reference potential (32) and integrated with the solar battery (13) with an insulating state kept therebetween by the insulating substrate (12), on substantially the entire area of a surface on a side, where the solar battery (13) is not formed, of the insulating substrate (12). The solar battery module (5) is mounted on a portable electronic device (1) with the electrode thin film (11) being connected to the reference potential (32).

24 Claims, 8 Drawing Sheets

FOREIGN PATENT DOCUMENTS

| | | | |
|---|---|---|---|
| JP | 57-66677 A | | 4/1982 |
| JP | 59-54269 A | | 3/1984 |
| JP | 60-144257 U | * | 9/1985 |
| JP | 61-113284 A | | 5/1986 |
| JP | 61-134058 U | | 8/1986 |
| JP | 63-234567 A | * | 9/1988 |
| JP | 1-95772 U | | 6/1989 |
| JP | 2-54755 A | * | 2/1990 |
| JP | 2-297976 A | | 12/1990 |
| JP | 4-111474 A | | 4/1992 |
| JP | 2000-221278 A | | 8/2000 |
| JP | 2000-292560 A | | 10/2000 |
| JP | 2001-185749 A | | 7/2001 |
| JP | 2001-264464 A | | 9/2001 |
| WO | WO 99/59210 A1 | * | 11/1999 |
| WO | WO 00/28513 A1 | * | 5/2000 |
| WO | WO 01/71434 A1 | * | 9/2001 |

OTHER PUBLICATIONS

Chen et al, "Low resistivity High Efficiency Silicon Solar Cells for Potential Space Application," 23rd Photovoltaic Specialists Conference, pp. 1409-1414, May 10-14, 1993.*

* cited by examiner

SOLAR CELL MODULE AND PORTABLE ELECTRONIC APPARATUS WITH IT

TECHNICAL FIELD

The present invention relates to a solar battery module having a structure capable of avoiding electrostatic-discharge damage and a portable electronic device with the same mounted thereon.

BACKGROUND TECHNOLOGY

A solar battery generates electric energy from sunlight or artificial light of an incandescent lamp, a fluorescent lamp, or the like. The solar battery is constituted by a power generating layer made of a material such as amorphous silicon or an amorphous silicon alloy, or a power generating layer using microcrystalline silicon, crystalline silicon, a compound semiconductor material, or the like as the material thereof, and is conventionally mounted on portable electronic devices such as wristwatches, radios, electronic desk-top calculators, PDAs (Personal Digital Assistants) and the like. The portable electronic device with a solar battery mounted thereon is configured to be driven by electronic energy which is generated by conversion by the solar battery and accumulated in a secondary battery, and is increasingly demanded every year since it has an advantage that there is no need for replacement of a button battery and the like.

Since the portable electronic device with a solar battery mounted thereon is often carried in constant contact with a human body like a wristwatch, static electricity which is accumulated in the human body may enter and break the solar battery, resulting in remarkable degradation in characteristics of the solar battery (the breakage of the solar battery caused by the static electricity is referred to as "electrostatic-discharge damage"). This electrostatic-discharge damage is prone to occur when the solar battery is formed on an insulating substrate in particular, and thus a conventional portable electronic device with such a solar battery mounted thereon is given measures against the electrostatic-discharge damage in such a manner as shown in FIG. 16.

Figure 16:
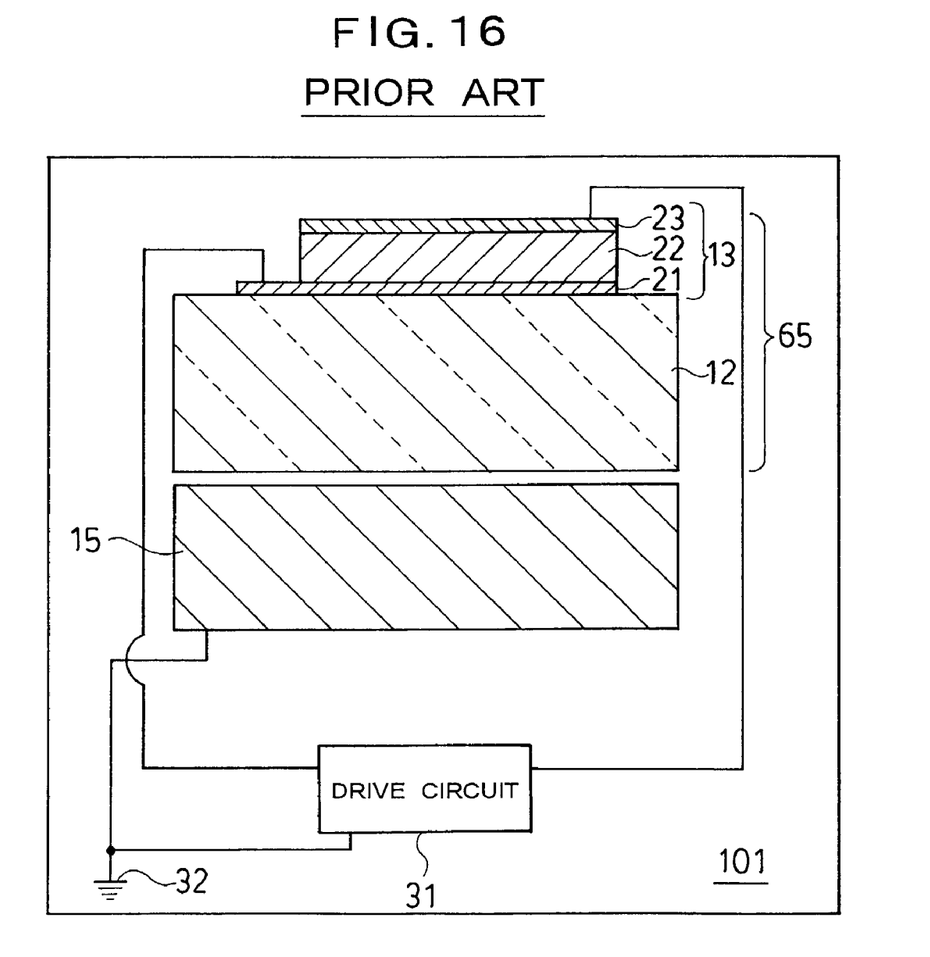
FIG. 16 is a cross-sectional view schematically showing a principal part of an internal structure of a portable electronic device with a conventional solar battery module mounted thereon.

FIG. 16 is a cross-sectional view showing an internal structure of a conventional portable electronic device 101 with a solar battery mounted thereon. A solar battery 13 is provided with a bottom electrode 21 and an opposite electrode 23 on respective faces of a power generating layer 22, and the bottom electrode 21 is formed on an insulating substrate 12 to constitute a solar battery module 65. Further, the bottom electrode 21 and the opposite electrode 23 are connected to a drive circuit 31, and a shielding metal plate 15, which is an individual unit, is disposed in the vicinity of the solar battery 13 on the drive circuit 31 side and connected to a reference potential 32 (grounded). In the conventional portable electronic device 101, a route for dissipating static electricity entering from the outside as described above to the reference potential 32 (hereinafter, this route is referred to as a "dissipation route of static electricity") is formed of the metal plate 15 to prevent the breakage of the solar battery 13.

However, since many portable electronic devices are downsized for convenience of carriage, they have accordingly great constraints on space for accommodating components and arrangement of them. Nevertheless, the conventional portable electronic device needs to separately secure a space for accommodating the metal plate 15, and thus there remains an extremely small margin of accommodating space of the components and arrangement of them, which presents a problem that flexibility in incorporating the components is remarkably low. In addition, the number of components increases by components associated with the metal plate 15, and the arrangement of the components needs to be separately devised for the parts associated with the metal plate 15, which presents a problem of increased cost.

The present invention is made to solve the above-described problems, and it is an object of the invention to provide a structure, in a solar battery module and a portable electronic device with the same mounted thereon, capable of avoiding electrostatic-discharge damage for higher reliability, and increasing flexibility in incorporating components for higher diversity, while having an advantage in cost.

DISCLOSURE OF THE INVENTION

A solar battery module according to the present invention is characterized by being provided with an electrostatic conductive thin film which is integrated with a solar battery with an insulating state kept therebetween and is connectable to a reference potential.

A solar battery module according to the present invention preferably comprises a solar battery formed on one surface of an insulating substrate; and an electrostatic conductive thin film formed on a surface, where the solar battery is not formed, of the insulating substrate and connectable to a reference potential.

Further, a solar battery module according to the present invention may comprise a solar battery formed on one surface of an insulating substrate; an insulating protective film formed on the one surface of the insulating substrate in a manner to cover substantially an entire face of the solar battery; and an electrostatic conductive thin film formed on a surface of the insulating protective film and connectable to a reference potential.

Furthermore, the insulating substrate may be made of a material having transparency, and the electrostatic conductive thin film may be made of a material having transparency.

Moreover, the electrostatic conductive thin film may be made of a transparent conductive oxide material or a transparent conductive resin composite, and may be made of a thin metal film having a film thickness so thin that light is capable of passing therethrough, or a thin metal film patterned in lines or in a mesh.

In addition, it is preferable that a resistance value of the electrostatic conductive thin film is set lower than a resistance value of the solar battery, and that the resistance value is set in consideration of a variation range of the resistance value exhibited by the solar battery.

Further, it is preferable that the electrostatic conductive thin film is formed to have a film thickness so thin as to be ignored as compared to the insulating substrate.

The solar battery module according to the present invention may be configured such that the solar battery is formed to have a film thickness so thin as to have light transmission properties, and that electrodes are formed on respective faces of a power generating layer thereof and a plurality of lacking parts are formed in the power generating layer and one of the electrodes so as not to impair the light transmission properties.

Moreover, the present invention provides a portable electronic device with a solar battery module mounted thereon, wherein the solar battery module comprises a solar battery formed on one surface of an insulating substrate and an electrostatic conductive thin film formed on a surface, where the solar battery is not formed, of the insulating substrate and connectable to a reference potential, and is mounted with the electrostatic conductive thin film being connected to the reference potential.

Further, the present invention provides a portable electronic device with a solar battery module mounted thereon, wherein the solar battery module comprises a solar battery formed on one surface of an insulating substrate, an insulating protective film formed on the one surface of the insulating substrate in a manner to cover substantially an entire face of the solar battery, and an electrostatic conductive thin film formed on a surface of the insulating protective film and connectable to a reference potential, and is mounted with the electrostatic conductive thin film being connected to the reference potential.

In both of the above-described portable electronic devices, it is preferable that the solar battery module is mounted thereon such that the electrostatic conductive thin film is disposed to face in an incident direction of incident light. Furthermore, it is preferable that the insulating substrate is made of a material having transparency, and that the electrostatic conductive thin film is made of a material having transparency.

Further, the present invention also provides a portable electronic device with a solar battery module mounted thereon, wherein the solar battery module comprises a solar battery formed on one surface of an insulating substrate, and an electrostatic conductive thin film formed on a surface, where the solar battery is not formed, of the insulating substrate, and wherein a movement for driving a hand by electric energy generated by the solar battery and the solar battery module are accommodated in a metal watch case, and the solar battery module is mounted with the electrostatic conductive thin film in contact with the metal watch case.

BEST MODE FOR CARRYING OUT THE INVENTION

Hereinafter, preferred embodiments for carrying out a solar battery module according to the present invention and a portable electronic device with the same mounted thereon will be explained in detail using the drawings. It should be noted that the same portions as those of the conventional portable electronic device shown in FIG. 16 are assigned the same numerals and symbols for explanation.

First Embodiment: FIG. 1 and FIG. 2, FIG. 7 and FIG. 8, and FIG. 15

Figure 1:
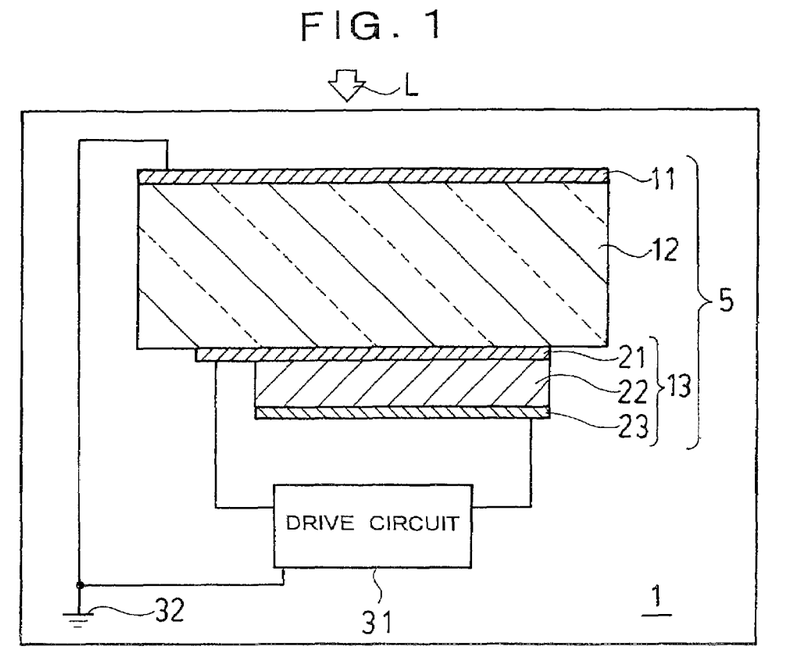
FIG. 1 and FIG. 2 are cross-sectional views schematically showing principal parts of internal structures of portable electronic devices with solar battery modules according to the invention mounted thereon respectively.

FIG. 1 is a cross-sectional view schematically showing a principal part of an internal structure of a portable electronic device 1 with a solar battery module 5 according to the invention mounted thereon.

The portable electronic device 1 is constituted by the solar battery module 5 and a drive circuit 31 accommodated therein. The solar battery module 5 is characterized by being provided with an electrode thin film 11 which is integrated with a solar battery 13 to be protected with an insulating state kept therebetween and is connectable to a reference potential 32. More specifically, the solar battery module 5 is configured such that the solar battery 13 is formed on a surface on one side of an insulating substrate 12, the electrode thin film 11 is formed on substantially the entire area on the other side, where the solar battery 13 is not formed, of the insulating substrate 12, and the electrode thin film 11 is connectable to the reference potential 32 (capable of being grounded). Further, the solar battery module 5 is mounted on the portable electronic device 1 such that the electrode thin film 11 is disposed to face in the incident direction of an incident light L such as sunlight or the like, and the electrode thin film 11 is connected to the reference potential 32.

In the portable electronic device 1 according to the invention, the solar battery module 5 is constituted by providing the electrode thin film 11 while the insulating state from the solar battery 13 is kept by the insulating substrate 12, in which the electrode thin film 11 is connected to the reference potential 32 to form a dissipation route of electrostatic electricity.

The solar battery 13 comprises a bottom electrode 21 and an opposite electrode 23 on respective faces of a power generating layer 22 as in the conventional one.

The power generating layer 22 is formed to be able to generate electric energy from light, and is, for example, an amorphous silicon film composed of a P-layer made of P-type semiconductor, an I-layer made of intrinsic semiconductor, and an N-layer made of N-type semiconductor. In this case, each layer is formed by, for example, a plasma chemical vapor deposition process. Further, the power generating layer 22 may be a film other than the amorphous silicon film, that is, may be, for example, an amorphous silicon alloy film, a microcrystalline silicon or a crystalline silicon film, a compound semiconductor film, or the like, as long as it uses a material capable of photoelectric conversion. The bottom electrode 21, which is a transparent electrode coating formed of a transparent material, is composed of, for example, an ITO film formed by a DC magnetron sputtering method, and connected to the drive circuit 31. Further, the opposite electrode 23, for which an electrode made of an opaque material such as a metal or the like may be used other than the transparent electrode coating, is also connected to the drive circuit 31.

The insulating substrate 12 is made of a material having insulating properties and has a film thickness of about 0.1 mm to about 3 mm. Preferably, the insulating substrate 12 is a transparent substrate made of a material having transparency, and thus, for example, a glass substrate is suitable. Further, the bottom electrode 21 is formed on a part of one face of the insulating substrate 12, the power generating layer 22 is laminated to cover the bottom electrode 21, and further the opposite electrode 23 is formed similarly to the bottom electrode 21 to cover the power generating layer 22 to thereby form the solar battery 13.

The electrode thin film 11, which is an electrostatic conductive thin film made of a material having electrostatic conductive properties, is made of, for example, an indium tin oxide (hereinafter, abbreviated to "ITO") film. The electrode thin film 11 is formed on substantially the entire area of one face of the insulating substrate 12, but it does not need to be formed on substantially the entire area, as long as the electrode thin film 11 is connectable to the reference potential 32. It should be noted that when the solar battery module 5 is mounted on a metal watch case 51 as described later, the formation of the electrode thin film 11 on substantially the entire area of one face of the insulating substrate 12 facilitates the connection thereof to the reference potential 32.

Furthermore, the resistance value of the electrode thin film 11 is set lower than that of the solar battery 13 so as to effectively form a dissipation route of static electricity in consideration of standards (IEC61340-5-1) by IEC (International Electrotechnical Commission) as well as in consideration of a variation range of the resistance value exhibited by the solar battery (for example, from about $10^{10}$ Ω/cm to about $10^{4}$ Ω/cm) that the resistance value is low when light is incident thereon and the resistance value is high when light is not incident thereon. Specifically, it is preferable to set a value defined by $R_s=\rho/d$ (hereinafter, the $R_s$ is referred to as a "surface resistance") at a value of about 10000 Ω/sq or lower where the volume resistivity is $\rho$ and the thickness is d and, more preferably, at a value of about 1000 Ω/sq or lower. When the surface resistance is set at the above value, the electrode thin film 11 can effectively dissipate static electricity entering from the outside to the reference potential. Moreover, it is preferable to set the surface resistance low in accordance with the configuration and the resistance value of the power generating layer 22.

The material of the electrode thin film 11 does not need to be ITO, and, for example, a transparent conductive oxide material such as ZnO, $SnO_2$ or the like can be used. Further, the electrode thin film 11 may be a coating, like an ITO microcrystalline film, made of a transparent conductive resin composite made by dispersing a transparent filler in a transparent resin, and may be a thin metal film (for example, a thin film of Ti (titanium), Al (aluminum), Au (gold), or the like) having a film thickness so thin that light can pass therethrough, or a thin metal film (for example, a thin film of Ti, Al, Au or the like) patterned in lines or in a mesh. Since the electrode thin film 11 is transparent in any case of the above, the electrode thin film 11 can be used when it is disposed to face in the incident direction of the incident light L. This makes it possible to transmit the incident light L to the solar battery 13.

When the electrode thin film 11 is the thin film that is formed to have a film thickness so thin as to be ignored as compared to the insulating substrate 12 and is, for example, the ITO film formed by the DC magnetron sputtering method, it is formed to be about 50 nm to about 200 nm. When the electrode thin film 11 is the thin metal film (for example, the thin film of Ti, Al or Au) having a film thickness so thin that light can pass therethrough, it is formed to have a film thickness of about 10 nm to about 100 nm. When the electrode thin film 11 is the thin metal film (for example, the thin film of Ti, Al or Au) patterned in lines or in a mesh, it is formed to have a film thickness of about 100 nm to about 500 nm.

Then, when the incident light L is made incident from the outside, the solar battery module 5 generates electric energy from the incident light by means of the power generating layer 22. The generated electric energy is extracted via the bottom electrode 21 and the opposite electrode 23 and accumulated in a not shown secondary battery to be energy for driving the drive circuit 31.

As described above, in the solar battery module 5, the electrode thin film 11 is formed and connected to the reference potential 32. When the reference potential 32 is formed by a metal case 33 shown in FIG. 15, the electrode thin film 11 is made contact with the metal case 33 to be connected to the reference potential 32. Thereby, a dissipation route r of static electricity is formed as shown in the drawing. Since the resistance value of the electrode thin film 11 is set lower than the resistance value of the solar battery 13, static electricity e flows in the electrode thin film 11 more easily than in the solar battery 13, and additionally the electrode thin film 11 is kept insulated from the solar battery 13 by the insulating substrate 12, so that the static electricity e entering the electrode thin film 11 never passes through the insulating substrate 12 into the solar battery 13. Therefore, the static electricity e entering the electrode thin film 11 dissipates to the reference potential (the metal case 33) via the dissipation route r of the static electricity. Consequently, the solar battery module 5 never receives electrostatic-discharge damage, so that characteristics of the solar battery 13 never degrade due to the influence of static electricity, resulting in high reliability.

Further, the electrode thin film 11 forming the dissipation route of the static electricity is integrated with the solar battery 13 to be protected and the insulating substrate 12, and is formed to have a film thickness much thinner than that of the insulating substrate 12 and the solar battery 13. Therefore, it is unnecessary to separately secure a space for accommodating the electrode thin film 11 and to take the trouble to consider the arrangement of the electrode thin film 11 when the solar battery module 5 is mounted on the portable electronic device 1. Consequently, the portable electronic device 1 can provide a margin of accommodating space and arrangement of components as compared to the prior art so as to increase the flexibility in incorporating the components, resulting in increased diversity. Further, it is also unnecessary to increase the number of components and to devise the arrangement of the components in order to form the dissipation route of the static electricity, which eliminates an increase in fabrication cost to offer a cost advantage. Furthermore, the solar battery module 5, in which the electrode thin film 11, the insulating substrate 12, and the solar battery 13 are integrated, is easy to handle. Accordingly, it is possible to reduce efforts in mounting and assembling the components as compared to the case in which the metal plate 15 and the solar battery module 65 are mounted in the portable electronic device as in the prior art.

Figure 2:
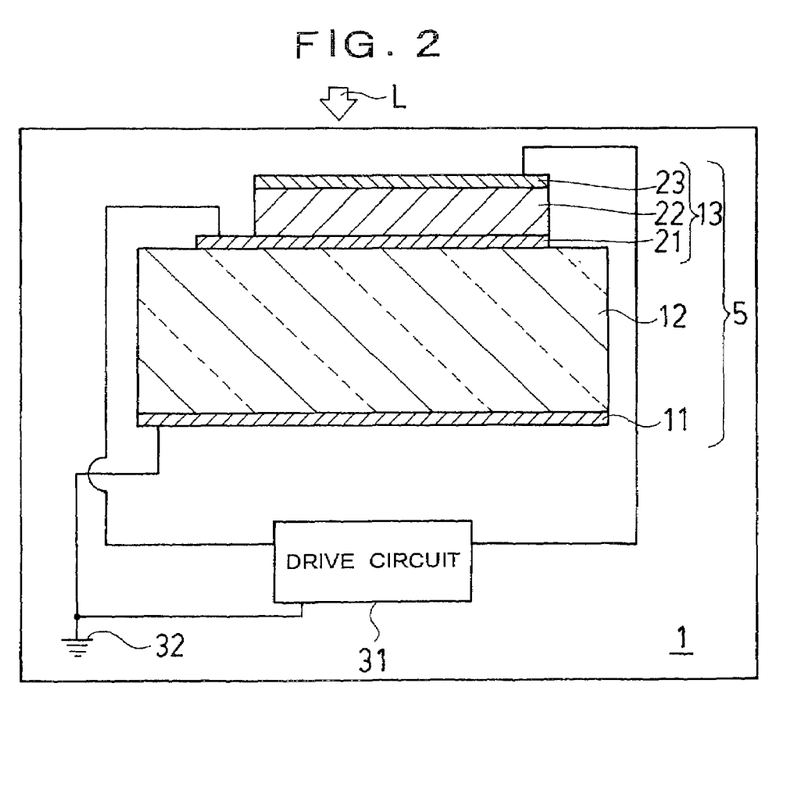

The portable electronic device 1, however, may be different in arrangement of the solar battery module 5 from that in FIG. 1. In other words, the solar battery module 5 may be mounted on the portable electronic device 1, as shown in FIG. 2, such that the solar battery 13 is disposed to face in the incident direction of the incident light L. The same operation and effect as those of the portable electronic device 1 shown in FIG. 1 are also presented in this case. However, when the solar battery module 5 is disposed as shown in FIG. 2, an output terminal part for extracting the electric energy generated by the solar battery 13 is necessarily formed on the opposite side to the drive circuit 31 with the insulating substrate 12 intervening therebetween, which might make it difficult to electrically connect the output terminal to the drive circuit 31. In this case, it is preferable to dispose the solar battery module 5 in such a manner as shown in FIG. 1. It should be noted that, in the case of the arrangement shown in FIG. 2, the electrode thin film 11, the insulating substrate 12, and the bottom electrode 21 does not need to be transparent. For, example, the electrode thin film 11 may be formed of a thin metal film made of Ti, Al, Au or the like or by applying a conductive paste material onto a rear face of the insulating substrate 12. Further, the solar battery module 5 in FIG. 2 is preferable in that a material of a ceramic substrate, a resin substrate, or the like can be used for the insulating substrate 12, and that, in addition to the same material as the thin metal film, a light reflecting metal material such as Ag (silver), Pt (platinum), or the like can be used for the bottom electrode 21.

Figure 7:
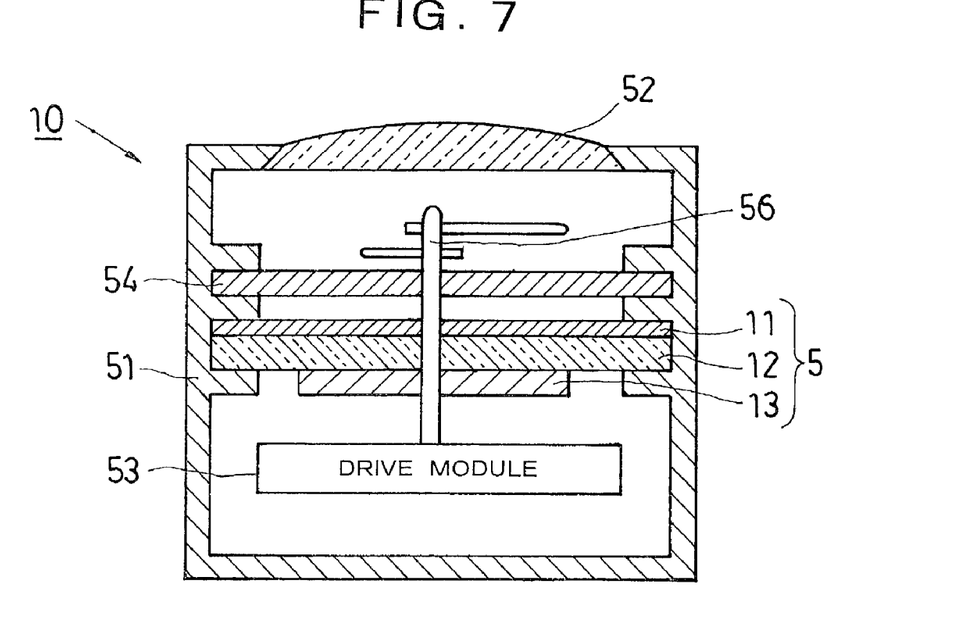
FIG. 7 and FIG. 8 are cross-sectional views schematically showing principal parts of internal structures of electronic watches with solar battery modules according to the invention mounted thereon respectively.
Figure 8:
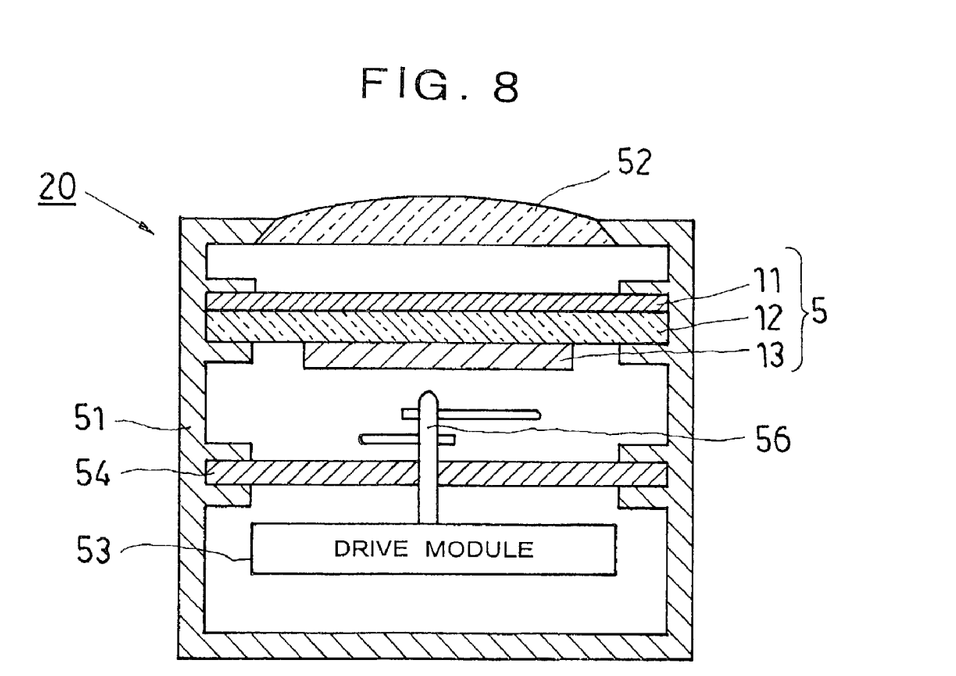

Next, an electrostatic-discharge damage test on the solar battery module 5 is explained. An electronic watch 10 and an electronic watch 20, each of which is of a type having hands and has the solar battery module 5 mounted thereon, were taken here as examples of the portable electronic device 1 and individually subjected to the later-described electrostatic-discharge damage test. Principal parts of internal structures of the electronic watch 10 and the electronic watch 20 are shown in FIG. 7 and FIG. 8 respectively. The electronic watch 10 shown in FIG. 7 is constituted by a transflective dial 54, the solar battery module 5 capable of generating power by light passing though the transflective dial 54, and a drive module (movement) 53 including a drive circuit which are accommodated inside the metal watch case 51 to which a glass 52 is fixed to supply the drive module 53 with the electric energy generated by the solar battery 13 of the solar battery module 5, in which a hand shaft 56 which is driven by the drive module 53 is disposed through the centers of the dial 54 and the solar battery module 5, and hour and minute hands are individually fixed on the hand shaft 56.

The electronic watch 20 shown in FIG. 8 has the same configuration as that of the electronic watch 10 except that the solar battery module 5 is disposed between the dial 54 and the glass 52. Further, the electronic watch 10 and the electronic watch 20 form reference potentials by the watch cases 51. The electrode thin film 11 provided in the solar battery module 5 is made contact with the watch case 51, so that the electrode thin film 11 is grounded to form the dissipation route of static electricity. In this case, the electrode thin film 11 and the watch case 51 are held at the same potential.

In the electronic watch 20, the solar battery module 5 is made into a later-described see-through module, in which not only a transflective material which is essential to the electronic watch 10 but also an opaque material may be used for the dial 54. Thereby, the incident light is not blocked by a member disposed on the upper side of the solar battery module 5 but made incident directly on the solar battery 13.

Then, the electrostatic-discharge damage test was conducted by applying a discharge voltage ranging from about 0.5 kV to about 3.0 kV to the watch case 51 and checking whether or not the electrostatic-discharge damage occurred. When the electrostatic-discharge damage tests were conducted on ten samples each of the electronic watches 10 and the electronic watches 20, there was no sample in either sample group in which occurrence of electrostatic-discharge damage was verified. Therefore, it has been shown from the results of the electrostatic-discharge damage tests that the portable electronic device 1 with the solar battery module 5 according to the invention mounted thereon can protect the solar battery 13 from static electricity.

Figure 3:
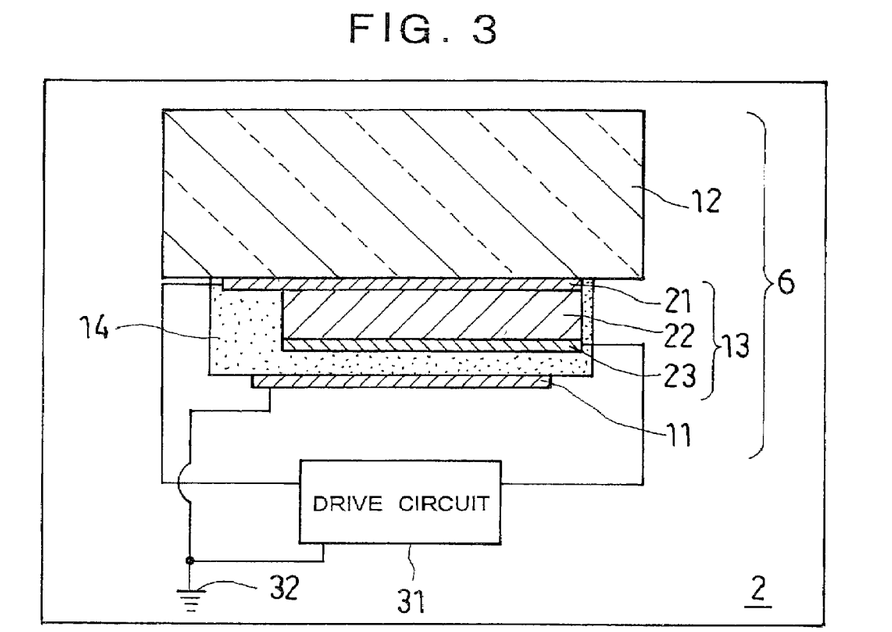
FIG. 3 and FIG. 4 are cross-sectional views schematically showing principal parts of internal structures of other portable electronic devices with other solar battery modules according to the invention mounted thereon respectively.
Figure 4:
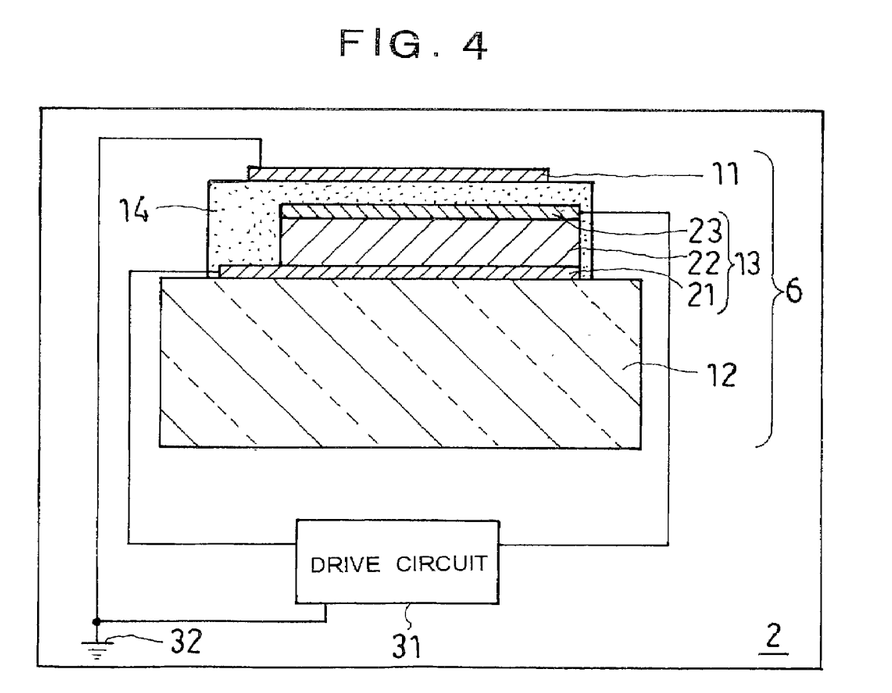

Second Embodiment: FIG. 3 and FIG. 4

FIG. 3 is a cross-sectional view schematically showing a principal part of an internal structure of a portable electronic device 2 with a solar battery module according to the invention mounted thereon.

The portable electronic device 2 differs from the portable electronic device 1 in that a solar battery module 6 is mounted thereon. The solar battery module 6 differs, as compared to the solar battery module 5, in that a protective film 14 is provided, and that an electrode thin film 11 is formed not on an insulating substrate 12 but on a surface of the protective film 14 on the side opposite to the insulating substrate 12 with a solar battery 13 intervening therebetween, and is in common therewith in the other structure. The solar battery module 6 is mounted on the portable electronic device 2 in which the solar battery 13 and the electrode thin film 11 are integrated while an insulating state is kept therebetween by the protective film 14 and the electrode thin film 11 is connected to a reference potential 32.

The protective film 14 is a thin insulating resin film made of a material of, for example, an acrylic resin, an epoxy resin, or a silicon resin and has a film thickness of about 10 μm to about 100 μm. The protective film 14 is formed on the insulating substrate 12 to cover substantially the entire face of the solar battery 13. It should be noted that a portable electronic device 2 shown in FIG. 4 is in common with the portable electronic device 2 shown in FIG. 3 except that the arrangement of a solar battery module 6 is different therefrom. Further, it is essential that the insulating substrate 12 has light transmission properties in the case of the arrangement shown in FIG. 3, and it is essential that the electrode thin film 11 and the protective film 14 have light transmission properties in the case of the arrangement shown in FIG. 4. As described above, the portable electronic device 2 is the same as the portable electronic device 1 in that a light transmitting material is used for members disposed on the incident side in order to allow the incident light to reach the solar battery 13. The other configuration, that is, the material and the film thickness of the electrode thin film 11 are the same as those of the portable electronic device 1.

Since the portable electronic device 2 is provided with the protective film 14, the solar battery 13 can be protected by the protective film 14. In addition, since the protective film 14 is an insulating resin film and intervenes between the electronic thin film 11 and the solar battery 13, the protective film 14 functions as the insulating substrate 12 of the portable electronic device 1 to integrate the electrode thin film 11 and the solar battery 13 while keeping the insulating state therebetween. Therefore, in the portable electronic device 2, the electrode thin film 11 forms the dissipation route of static electricity and the electrode thin film 11 and the solar battery 13 are insulated from each other by the protective film 14, which makes it possible to dissipate static electricity entering the electrode thin film 11 to the reference potential 32 so as to prevent the static electricity from entering the solar battery 13.

When ten samples were also prepared for each of the above-described portable electronic devices 2 in FIG. 3 and FIG. 4 and electrostatic-discharge damage tests were conducted on them in the same manner as those on the portable electronic devices 1, there was no sample in either sample group in which occurrence of electrostatic-discharge damage was verified. It has been shown from the results of the electrostatic-discharge damage tests that the portable electronic device 2 can also protect the solar battery 13 from static electricity.

Third Embodiment: FIG. 5 and FIG. 6, and FIG. 9 to FIG. 14

Figure 5:
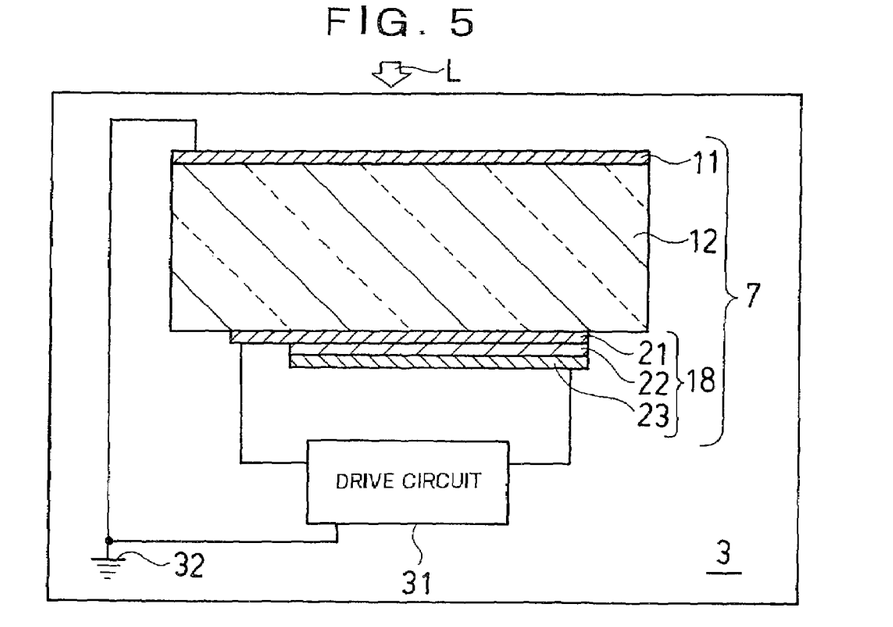
FIG. 5 and FIG. 6 are cross-sectional views schematically showing principal parts of internal structures of portable electronic devices with see-through solar battery modules according to the invention mounted thereon respectively.
Figure 6:
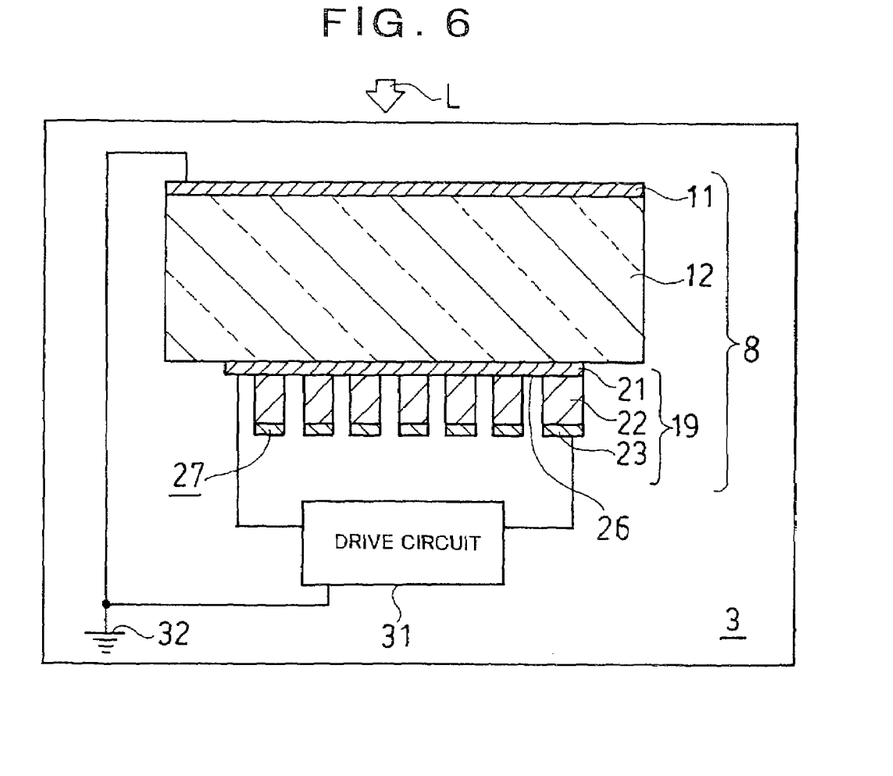

FIG. 5 and FIG. 6 are cross-sectional views schematically showing principal parts of internal structures of portable electronic devices 3 with other solar battery modules 7 and 8 according to the invention mounted thereon respectively. The solar battery modules 7 and 8 are, differing from the solar battery module 5, constituted by solar batteries 18 and 19 having light transmission properties, respectively. In other words, the solar battery modules 7 and 8 are formed so that both electrode thin films 11 and insulating substrates 12 are made transparent and the solar batteries 18 and 19 are structured to have light transmission properties. In the portable electronic devices 3, the solar battery modules 7 and 8 are mounted thereon such that the electrode thin films 11 are disposed to face in incident directions of incident lights L and connected to reference potentials 32. In the portable electronic devices 3, the incident lights L pass through the electrode thin films 11 and the insulating substrates 12 and also pass through the solar batteries 18 and 19 to reach members disposed thereunder (for example, dials of watches). Therefore, the solar battery modules 7 and 8 allow information thereunder to be recognized through the solar batteries 18 and 19 (hereinafter, such solar battery modules are referred to as "see-through modules").

Next, means for making the solar battery module into a see-through module are explained. First of all, a first means is, as shown in FIG. 5, to make the solar battery 18 into a thin type structure having a film thickness so thin as to have light transmission properties. In the solar battery 18, as in the first embodiment, a bottom electrode 21 is formed on a face of the insulating substrate 12, a power generating layer 22 is laminated in a manner to cover the bottom electrode 21, and further an opposite electrode 23 is formed similarly to the bottom electrode 21 in a manner to cover the power generating layer 22. The power generating layer 22, however, is formed to have a very small film thickness such as about 40 nm to about 200 nm. When the power generating layer 22 is formed to have such a thin film thickness, blockage of light by the power generating layer 22 is restrained to a minimum, so that the solar battery module 7 becomes a see-through module. Incidentally, in the solar battery module 7, the solar battery 18 may be covered with a protective film 14 to be a solar battery with a protective film. In this case, the electrode thin film 11 should be formed on a part of a surface of the protective film 14 on the opposite side to the insulating substrate 12 with the solar battery 18 intervening therebetween.

Then, the above-described solar battery modules 7 with a protective film and without a protective film are mounted on watch cases 51 respectively in the same manner as that of the first embodiment to obtain electronic watches. When ten samples were prepared for each of the electronic watches and electrostatic-discharge damage tests were conducted on them in the above-described manner, there was no sample in either sample group in which occurrence of electrostatic-discharge damage was verified. It has been shown from the results of the electrostatic-discharge damage tests that the solar battery module according to the invention can also protect the see-through solar battery from static electricity.

A second means for making the solar battery module into a see-through module is disclosed in PCT application (Application Number: PCT/JP99/06247, International Publication Number: WO00/28513) by the present applicant. Specifically, as shown in FIG. 6, the solar battery module 8 is constituted by forming the solar battery 19 such that while the power generating layer 22, the opposite electrode 23, and further the bottom electrode 21 as necessary are formed into linear elements 27 having a width too narrow to be recognized by the naked eye, the other part is formed into lacking parts 26 partially lacking so as not to impair the light transmission properties. As a result, in the solar battery 19, of the incident light L, light passing through the linear elements 27 contributes to the power generation by the power generating layer 22, while light passing through the lacking parts 26 never contributes to the power generation but is allowed to pass through the solar battery 19. Further, since each of the linear elements 27 is formed into a narrow width having a width too narrow to be recognized by the naked eye, the existence of the linear elements 27 cannot be recognized by the naked eye. Therefore, the solar battery 19 is recognized as transparent by the naked eye as well as the electrode thin film 11 and the insulating substrate 12, which results in that the solar battery module 8 is a see-through module.

It is suitable that each of the linear elements 27 is formed into a narrow width having a width too narrow to be recognized by the naked eye, but since a human eye instantly feels odd when an irregular pattern exists, the linear elements 27 are preferably formed adjacent and in parallel to each other and spaced at regular intervals. Further, as for a width W of each of the linear elements 27 and an arrangement space P between the linear elements 27, it is preferable that the width W of each linear element 27 is made as narrow as possible and the arrangement space P is made as wide as possible. However, if the width W of each of the linear elements 27 is made extremely narrow, the resistance value increases to decrease the efficiency of the power generation by the solar battery 19, and thus it is necessary to set a width which does not cause the resistance value to increase more than required. From the points of view, it is desirable to set the width W of each linear element 27 and the arrangement space P so that the ratio of the area occupied by the solar battery 19 to the insulating substrate 12 is about 20% or lower and the light transmittance of the solar battery 19 is about 70% or more. For example, the width W of each linear element 27 is preferably about 200 µm or lower, and more desirably about 20 µm or lower. However, if the width W of each linear element 27 is made narrower than about 8 µm, the resistance value increases, and thus the width W of each linear element 27 shall be about 8 µm or more. Further, each arrangement space (the width of the lacking part 26) P between the linear elements 27 is desirably at least about 50 µm or more.

Figure 9:
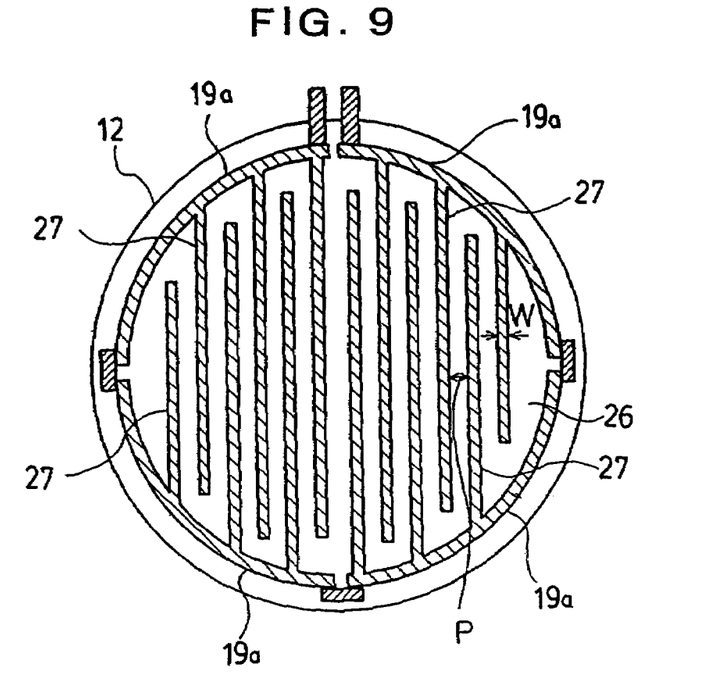
FIG. 9 to FIG. 14 are plane views showing see-through solar battery modules having different arrangement patterns according to the invention.

It is conceivable to realize the solar battery 19 satisfying the aforementioned conditions by, for example, a solar battery 19 shown in FIG. 9. The solar battery 19 is obtained by arranging, on the insulating substrate 12 in a round shape, four solar battery cells 19a each of which occupies substantially an area of one fourth of the round and connecting the solar battery cells 19a in series, in which the linear elements 27 form one arrangement pattern. The arrangement pattern is formed such that a plurality of linear elements 27 (three linear elements in FIG. 9) having different lengths of each of the solar battery cells 19a vertically located each other in the drawing fit in each other in the shape of comb teeth.

Figure 10:
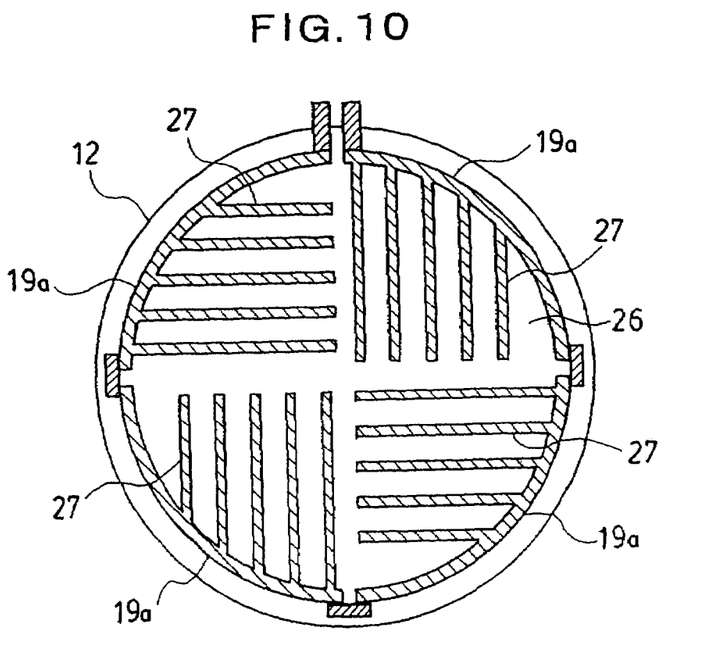
Figure 11:
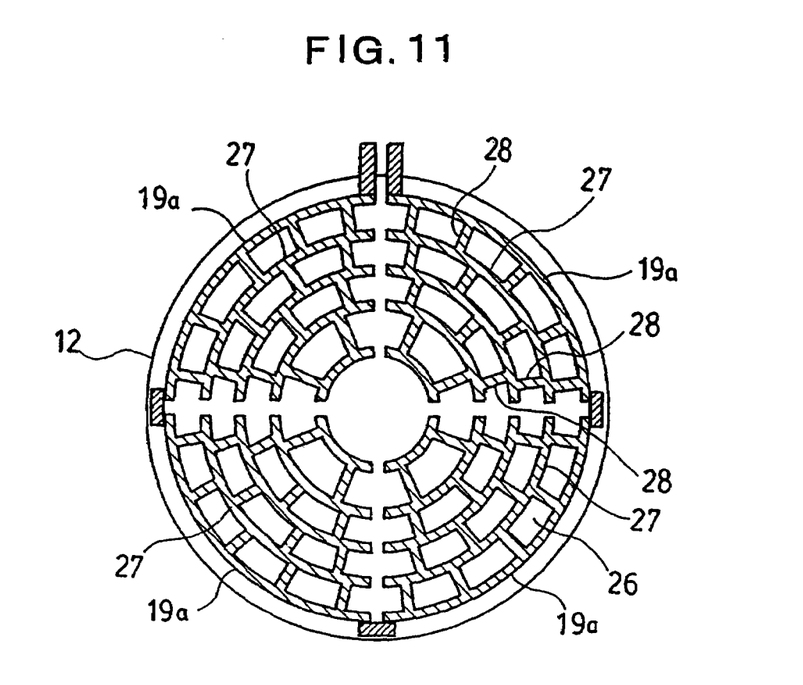
Figure 12:
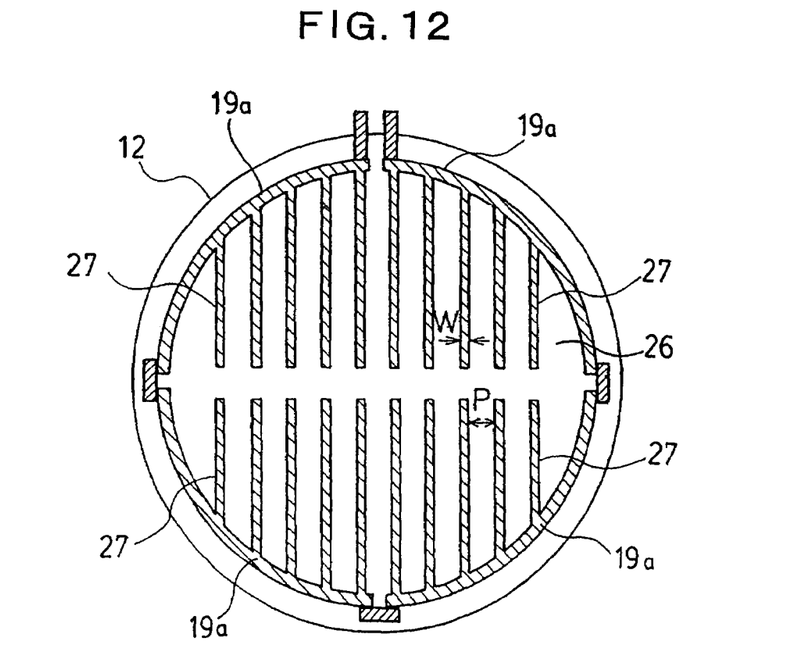
Figure 13:
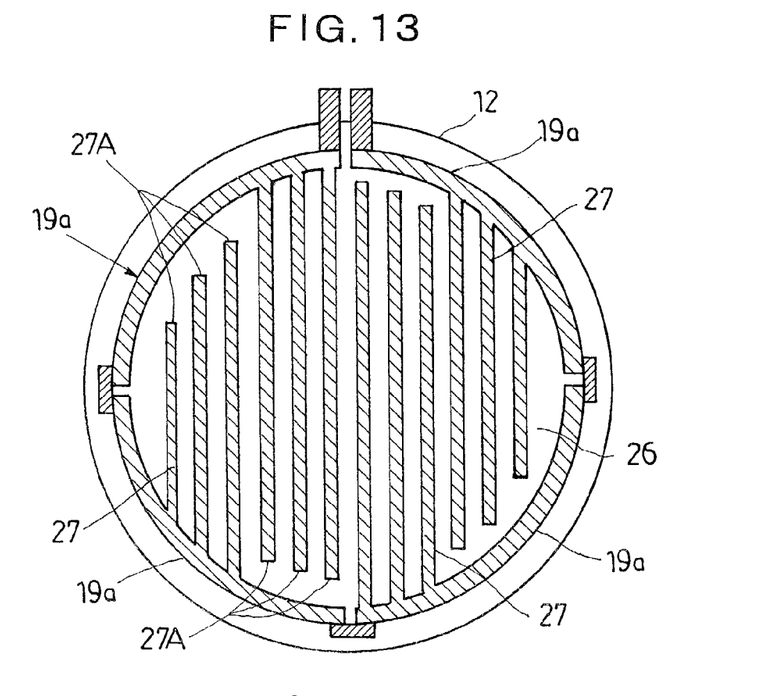
Figure 14:
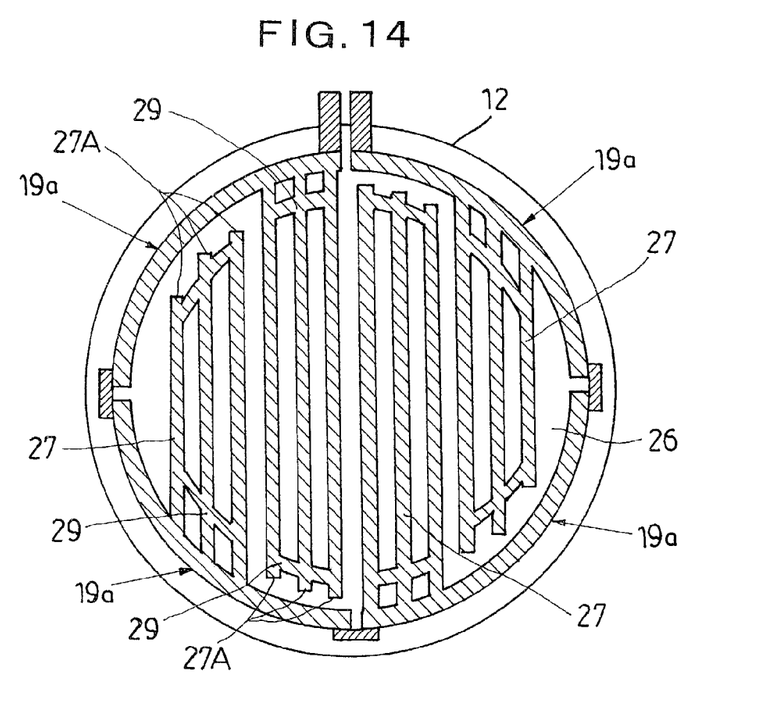
Figure 15:
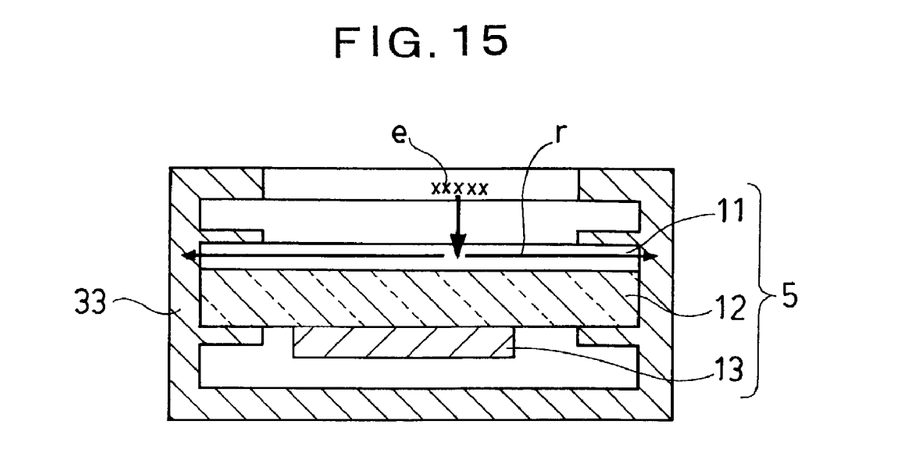
FIG. 15 is a cross-sectional view schematically showing a principal part of an internal structure of a portable electronic device with the solar battery module shown in FIG. 1 installed in a metal case.

Further, there are arrangement patterns shown in FIG. 10 to FIG. 14 as the arrangement pattern by the linear elements 27 in addition to the one shown in FIG. 9. In the arrangement pattern shown in FIG. 10, a plurality of linear elements 27 (five linear elements each in FIG. 10) each having different lengths are formed in parallel from each of the solar battery cells 19a, and the arrangement directions of the linear elements 27 are made different from each other for each solar battery cell 19a. In FIG. 10, the arrangement directions are made different by 90 degrees each. The arrangement pattern shown in FIG. 11 is formed such that a plurality of linear elements 27 in an arc shape are concentrically arranged and bridge parts 28, which connect the curved linear elements 27 formed in an arc shape, are arranged at appropriate positions. In the arrangement pattern shown in FIG. 12, a plurality of linear elements 27 (five linear elements each in FIG. 12) each having different lengths are formed in parallel at each of the solar battery cells 19a, and the arrangement directions of the linear elements 27 are made aligned in a fixed direction (in the vertical direction in the drawing). The arrangement pattern shown in FIG. 13 is formed such that a plurality of linear elements 27 (three linear elements each in FIG. 13) each having different lengths are formed in parallel from each of the solar battery cells 19a, and every three linear elements 27 forms a linear element group 27A and the linear element groups 27A fit in each other in the shape of comb teeth. Further, the arrangement pattern shown in FIG. 14, as compared to the pattern shown in FIG. 13, differs therefrom in that the linear elements 27 constituting each linear element group 27A are coupled to each other by bridge parts 29.

Furthermore, in order to make the solar battery module into a see-through module, the power generating layer 22 and the opposite electrode 23 may be formed with a plurality of lacking parts (through holes) in an arbitrary shape such as a circle, an ellipse, a triangle, a square or the like, though they are not shown, so as not to impair the light transmission properties.

Then, the solar battery module 8 which was made into a see-through type as described above was mounted on the watch case 51 in the same manner as that of the first embodiment, and when ten samples were prepared for each arrangement pattern and electrostatic-discharge damage tests were conducted on them in the above-described manner, there was no sample in any of the arrangement patterns in which occurrence of electrostatic-discharge damage was verified. Further, the solar battery 19 may be covered with the protective film 14 to form the solar battery module 8 with a protective film, also in which case there was no sample in which occurrence of electrostatic-discharge damage by the above-described electrostatic-discharge damage tests was verified. It has been shown from the results of the electrostatic-discharge damage tests that the solar battery module 8 according to the present invention can also protect the see-through solar battery provided with the linear elements and lacking parts from static electricity.

It should be noted the solar battery module 7 or the solar battery module 8 of the see-through type is not disposed only between the glass 52 and the dial 54 as shown in FIG. 8 but may also be disposed directly on the dial 54. This arrangement can also provide the same operation and effect as in the case of FIG. 8.

COMPARATIVE EXAMPLE

Next, in order to compare to the solar battery module according to the invention, each of the above-described solar battery module 5 and the solar battery module 6 was mounted on the watch case 51 shown in FIG. 7 and ten samples were prepared for each of electronic watches. However, each of the solar battery module 5 and the solar battery module 6 is mounted in each sample such that the electronic thin film 11 is not in contact with the watch case 51 (not shown). Then, when an electrostatic-discharge damage test was conducted on each sample by applying a discharge voltage of about 0.5 kV to the watch case 51 in the above-described manner, it was verified that there were eight samples in which electrostatic-discharge damage occurred to break the solar batteries 13 of the mounted solar battery modules thereof. It has been shown from the results that when the electrode thin film 11, even if it is formed, is not allowed to contact with the watch case 51, that is, when the film is not connected to the reference potential 32, the solar battery cannot stand electrostatic-discharge damage. Consequently, the electrode thin film 11 is connected to the reference potential 32 to serve the function of protecting the solar battery from static electricity.

INDUSTRIAL APPLICABILITY

In a solar battery module according to the present invention and a portable electronic device with the same mounted thereon, an electrostatic conductive thin film is connected to a reference potential to thereby make it possible to dissipate static electricity entering to the reference potential so as to avoid electrostatic-discharge damage. Further, it is possible to provide a margin of accommodating space and arrangement of components as compared to the prior art to increase the flexibility in incorporating the components. It is also unnecessary to consider the accommodating space and the arrangement of the electrostatic conductive thin film in mounting the solar battery module, which offers an advantage in cost.

What is claimed is:

1. A portable electronic device carried by a human with a solar battery module mounted thereon,
   wherein said solar battery module comprises a solar battery formed on one surface of an insulating substrate and an electrostatic conductive thin film formed on a surface, where said solar battery is not formed, of said insulating substrate and connectable to a reference potential, and
   wherein said solar battery module is accommodated in a metal case forming the reference potential, and said solar battery module is mounted with said electrostatic conductive thin film in direct contact with said metal case.

2. A portable electronic device carried by a human with a solar battery module mounted thereon,
   wherein said solar battery module comprises a solar battery formed on one surface of an insulating substrate, an insulating protective film formed on the one surface of said insulating substrate in a manner to cover a face of said solar battery, and an electrostatic conductive thin film formed on a surface of said insulating protective film and connectable to a reference potential, and
   wherein said solar battery module is accommodated in a metal case forming the reference potential, and said solar battery module is mounted with said electrostatic conductive thin film in direct contact with said metal case.

3. The portable electronic device according to claim 1, wherein said solar battery module is mounted thereon such that said electrostatic conductive thin film is disposed to face in an incident direction of incident light.

4. The portable electronic device according to claim 2, wherein said solar battery module is mounted thereon such that said electrostatic conductive thin film is disposed to face in an incident direction of incident light.

5. The portable electronic device according to claim 1, wherein said insulating substrate is made of a material having transparency, and said electrostatic conductive thin film is made of a material having transparency.

6. The portable electronic device according to claim 2, wherein said insulating substrate is made of a material having transparency, and said electrostatic conductive thin film is made of a material having transparency.

7. A portable electronic device according to claim 1, wherein said metal case is a metal watch case, and wherein a movement for driving a hand by electric energy generated by said solar battery and said solar battery module are accommodated in said metal watch case.

8. The portable electronic device according to claim 2, wherein said metal case is a metal watch case, and wherein a movement for driving a hand by electric energy generated by said solar battery and said solar battery module are accommodated in said metal watch case.

9. The portable electronic device according to claim 5, wherein said electrostatic conductive thin film is made of a transparent conductive oxide material or a transparent conductive resin composite.

10. The portable electronic device according to claim 6, wherein said electrostatic conductive thin film is made of a transparent conductive oxide material or a transparent conductive resin composite.

11. The portable electronic device according to claim 5, wherein said electrostatic conductive thin film is made of a thin metal film having a film thickness so thin that light is capable of passing therethrough, or a thin metal film patterned in lines or in a mesh.

12. The portable electronic device according to claim 6, wherein said electrostatic conductive thin film is made of a thin metal film having a film thickness so thin that light is capable of passing therethrough, or a thin metal film patterned in lines or in a mesh.

13. The portable electronic device according to claim 1, wherein a resistance value of said electrostatic conductive thin film is set lower than a resistance value of said solar battery.

14. The portable electronic device according to claim 2, wherein a resistance value of said electrostatic conductive thin film is set lower than a resistance value of said solar battery.

15. The portable electronic device according to claim 13, wherein the resistance value of said electrostatic conductive thin film is set at a value of 10000 $\Omega$/sq or lower.

16. The portable electronic device according to claim 14, wherein the resistance value of said electrostatic conductive thin film is set at a value of 10000 $\Omega$/sq or lower.

17. The portable electronic device according to claim 1, wherein said electrostatic conductive thin film is formed to have a film thickness so thin as to be ignored as compared to said insulating substrate.

18. The portable electronic device according to claim 2, wherein said electrostatic conductive thin film is formed to have a film thickness so thin as to be ignored as compared to said insulating substrate.

19. The portable electronic device according to claim 1, wherein said solar battery is formed to have a film thickness so thin as to have light transmission properties.

20. The portable electronic device according to claim 2, wherein said solar battery is formed to have a film thickness so thin as to have light transmission properties.

21. The portable electronic device according to claim 1, wherein said solar battery is formed with electrodes on respective faces of a power generating layer thereof, and formed with a plurality of lacking parts in said power generating layer and one of said electrodes so as not to impair light transmission properties.

22. The portable electronic device according to claim 2, wherein said solar battery is formed with electrodes on respective faces of a power generating layer thereof, and formed with a plurality of lacking parts in said power generating layer and one of said electrodes so as not to impair light transmission properties.

23. The portable electronic device according to claim 21, wherein said power generating layer and said electrodes are formed into linear elements having a narrow width, and lacking parts are formed between said linear elements.

24. The portable electronic device according to claim 22, wherein said power generating layer and said electrodes are formed into linear elements having a narrow width, and lacking parts are formed between said linear elements.

* * * * *